United States Patent [19]

Matsuzaki et al.

[11] Patent Number: 5,142,101
[45] Date of Patent: Aug. 25, 1992

[54] ELECTROMAGNETIC-SHIELDING GASKET

[75] Inventors: Toru Matsuzaki, Nagoya; Akio Yamaguchi, Kasugai; Hideo Yumi, Nagoya, all of Japan

[73] Assignee: Kitagawa Industries Co., Ltd., Japan

[21] Appl. No.: 772,213

[22] Filed: Oct. 7, 1991

[30] Foreign Application Priority Data

Nov. 29, 1990 [JP] Japan ............................ 2-127253[U]

[51] Int. Cl.⁵ .............................................. H05K 9/00
[52] U.S. Cl. ............................ 174/35 GC; 277/235 R; 277/230
[58] Field of Search ........... 277/227, 228, 229, 235 R; 174/35 GC, 35 R, 35 MS; 361/424; 219/10.55 D, 10.55 R

[56] References Cited

U.S. PATENT DOCUMENTS

| Re. 33,256 | 7/1990 | Busby. | |
|---|---|---|---|
| 2,519,850 | 8/1950 | Pierson, Jr. | |
| 2,727,084 | 2/1955 | Schreibar. | |
| 3,026,367 | 3/1962 | Hartwell | 174/35 GC |
| 3,312,769 | 4/1967 | La Kaff. | |
| 3,413,406 | 11/1968 | Plummer | 174/35 GC |
| 3,578,764 | 5/1971 | Nunnally | 277/230 |
| 3,812,316 | 5/1974 | Milburn | 219/10.55 |
| 3,889,043 | 6/1975 | Ducros. | |
| 4,065,138 | 12/1977 | Severinsen | 277/230 |
| 4,098,633 | 7/1978 | Kersten. | |
| 4,652,695 | 3/1987 | Busby | 174/35 GC |
| 4,857,668 | 8/1989 | Buonanno | 174/35 GC |
| 4,931,326 | 6/1990 | Weil | 428/35.8 |
| 5,028,739 | 7/1991 | Keyser et al. | 174/35 GC |
| 5,045,635 | 9/1991 | Kaplo et al. | 174/35 GC |
| 5,068,493 | 11/1991 | Benn, Sr. et al. | 174/35 GC |

FOREIGN PATENT DOCUMENTS 2174551  11/1986  United Kingdom.

Primary Examiner—Leo P. Picard
Assistant Examiner—Bot Lee Ledynh
Attorney, Agent, or Firm—Davis, Bujold & Streck

[57] ABSTRACT

An electromagnetic-shielding gasket of the present invention shields electronic components from electromagnetic waves by covering a surface of a resilient core with metal mesh and inserting the core into a joint of a conductive housing which contains electronic components. The core comprises an installing portion which is fixed to the joint of the conductive housing. A segregating portion or area separates the metal mesh from the surface of the core in the corner portions so that when the core elastically deforms greatly during insertion or use of the gasket, the metal mesh does not break as the core presses and pulls the metal mesh.

20 Claims, 11 Drawing Sheets

ELECTROMAGNETIC-SHIELDING GASKET

BACKGROUND OF THE INVENTION

This invention relates to an electromagnetic-shielding gasket installed in a gap of a joint of a conductive housing (hereinafter referred to as a housing) for containing electronic components or in a gap of a joint between a housing and a closure.

Recently, office equipments such as electronic typewriters and printers, household appliances such as washing machines and vacuum cleaners and the like increasingly use electronic components such as microcomputers. Even automobiles equipped with electronic control systems for fuel injection and the like are becoming very common. Thus, the number of microcomputers is increasing, and the clock frequency of microcomputers is also becoming higher. Consequently, the noise generated from electronic components leaks and enters through the gap in the housing of electronic components, and can be transmitted to other electronic components. The noise may cause malfunctions to the overall equipment as well as the electronic components.

To shield electronic components from electromagnetic waves, an electromagnetic-shielding gasket is usually inserted into a gap in the housing of the electronic components. The electromagnetic-shielding gasket comprises a resilient core covered with a metal mesh. By installing the gasket in the gap of the joint in the housing, electromagnetic waves are reflected and/or absorbed by the conductive housing and the gasket. The electronic components in the housing are thus protected from electromagnetic waves.

Conventionally, the electromagnetic-shielding gasket comprises the resilient core so as to fit in the gap of the joint of the housing easily. The gasket has also enough durability against the compression of the core. However, the metal mesh is not resilient and thus deforms greatly at the corner of the core which deforms elastically to a great extent, when the core is compressed frequently by the closure and the like. As a result, the metal mesh may break, and the gasket therefore can not shield the electronic components sufficiently from electromagnetic waves.

SUMMARY OF THE INVENTION

The object of this invention is to solve the above mentioned problems and to provide an electromagnetic-shielding gasket for shielding electronic components from electromagnetic waves when the gasket is inserted into a joint of a conductive housing which carries the electronic components, said gasket comprising:
  a core comprising:
    a body for engaging a first surface of the joint of the conductive housing,
    an installing portion, connected to the body, for securing the gasket to a second surface of the joint of the conductive housing, and
    at least one transition portion;
  a metal mesh circumscribing the body, the installing portion and the at least one transition portion; and
  means for attaching the metal mesh to a substantial portion of the core;
  wherein the at least one transition portion is free of the attaching means thereby forming a segregating portion in the at least one transition portion, the segregating portion allows the metal mesh to move freely adjacent the at least one transition portion and thereby prevents the metal mesh from breaking when the core is subjected to the elastic deformation during positioning of the gasket in the joint of a conductive housing and during use of the gasket.

The core is fixed to a part of the joint of the housing by means of the installing portion. The surface of the core is covered with the metal mesh for shielding electronic components from electromagnetic waves. The corner portion of the core elastically deforms greatly, when the core is compressed. However, the segregating portion prevents the metal mesh from breaking when the core bends or pulls the metal mesh due to the elastic deformation of the core.

DETAIL DESCRIPTION OF THE PREFERRED EMBODIMENTS

Figure 1:
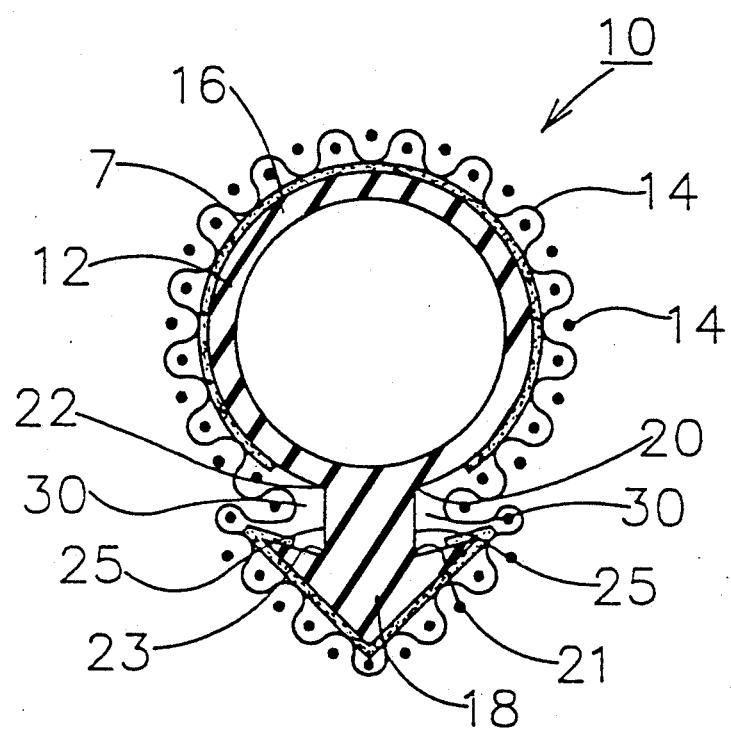
FIG. 1 is a cross-sectional view of an electromagnetic-shielding gasket showing a first embodiment of the present invention.

Hereinafter, the twelve embodiments of this invention will be explained with reference to the drawings.

FIGS. 1 through 4 show the first embodiment of the invention. An electromagnetic-shielding gasket 10 of the first embodiment comprises a core 12 and a metal mesh 14. The core 12 has a length equal to the length of a gap of a joint of a housing 1. The core 12 comprises a cylindrical hollow body 16 and an arrow or anchor-shaped installing portion 18 with a corner or transition portion 25, having corners 20 through 23, located between the body 16 and the installing portion 18. The corner portion 25 has corners 20 through 23 in this embodiment. The corner or transition portion 25 may be acute angles, obtuse angles and/or acute or sharp bends in the core surface except for smooth curves and flat portions. The core 12 is made of silicone rubber having a desired resiliency.

The surface of the core 12 is entirely covered with the metal mesh 14. Metal mesh 14 consists of a metal wire such as tinning copper wire, copper-weld wire (tinning, copper, steel), monel wire (copper, nickel alloy), stainless wire, aluminum wire, tinning copper foil wire (polyester fiber, or aramid fiber, polyimide fiber spirally coated with tinning copper foil) and the like.

Figure 2:
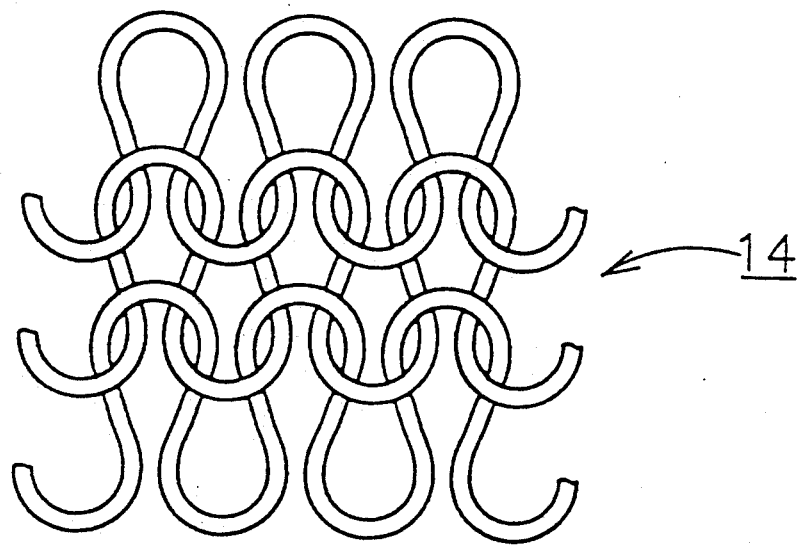
FIG. 2 is an enlarged view showing how to knit the metal mesh of FIG. 1.
Figure 3:
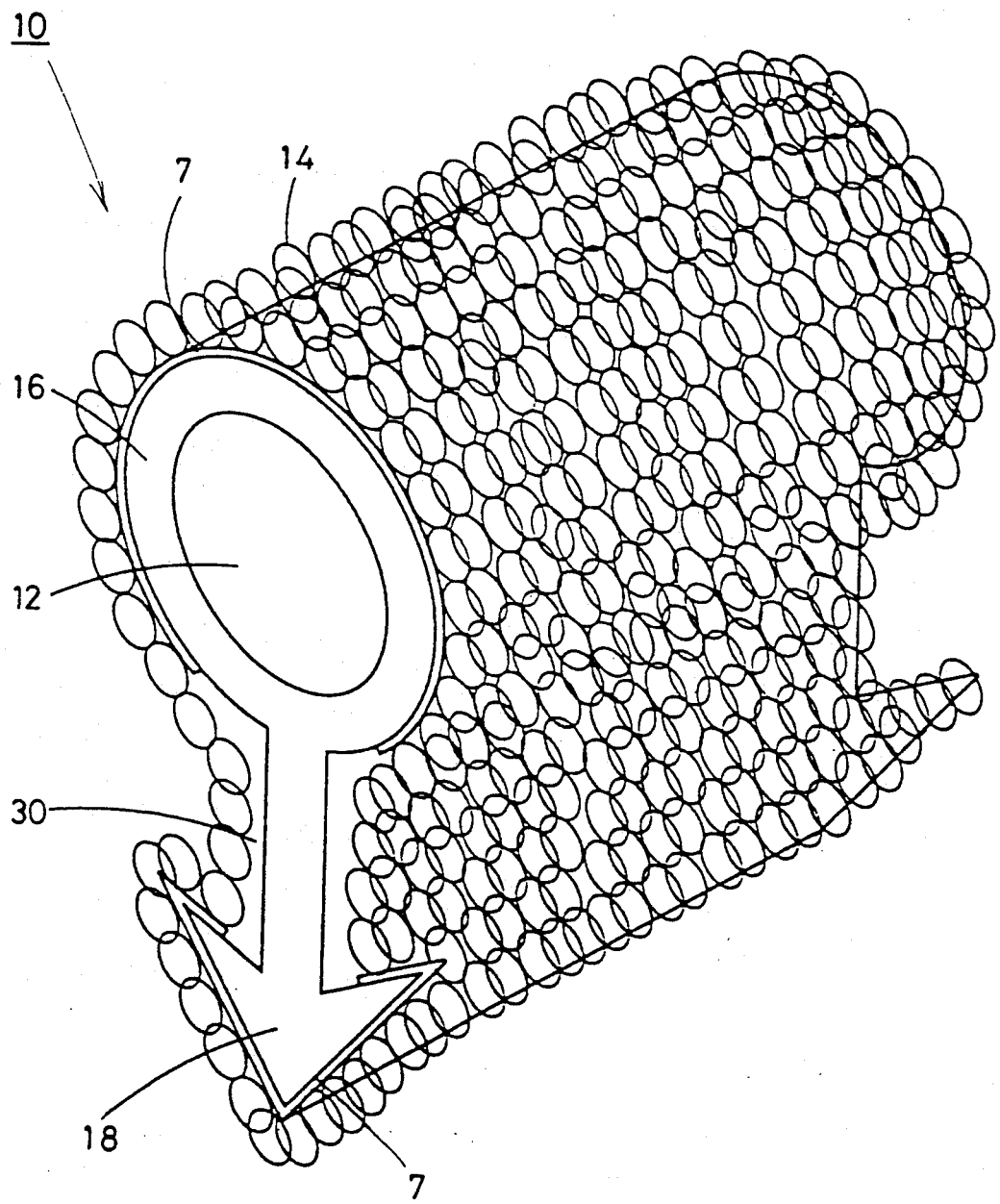
FIG. 3 is a perspective view of the electromagnetic-shielding gasket of FIG. 1.

The metal mesh 14, for example as seen in FIG. 2, is knitted in an interlocked configuration and adhered onto the surface of the core 12 by a rubber macromolecules adhesive 7. As seen in FIG. 1, a segregating area or portion 30 is formed on the surface of the corner portion 25 between the body 16 and the installing portion 18. The segregating portion 30 is not coated with the adhesive 7, so that the core 12 is separated from the metal mesh 14 and the metal mesh 14 is allowed to move or flex freely in the corner or transition portions. However, the core 12 could be coated with the adhesive 7 entirely. In this case, the metal mesh 14 is adhered to a smooth curve and a flat portion of the core 12 except for the surface of the corner portion 25 having acute angles and obtuse angles. The corner portion 25 thus becomes the segregating portion 30.

Hereinafter, an installation and action of the electromagnetic-shielding gasket 10 constructed as above will be explained.

Figure 4:
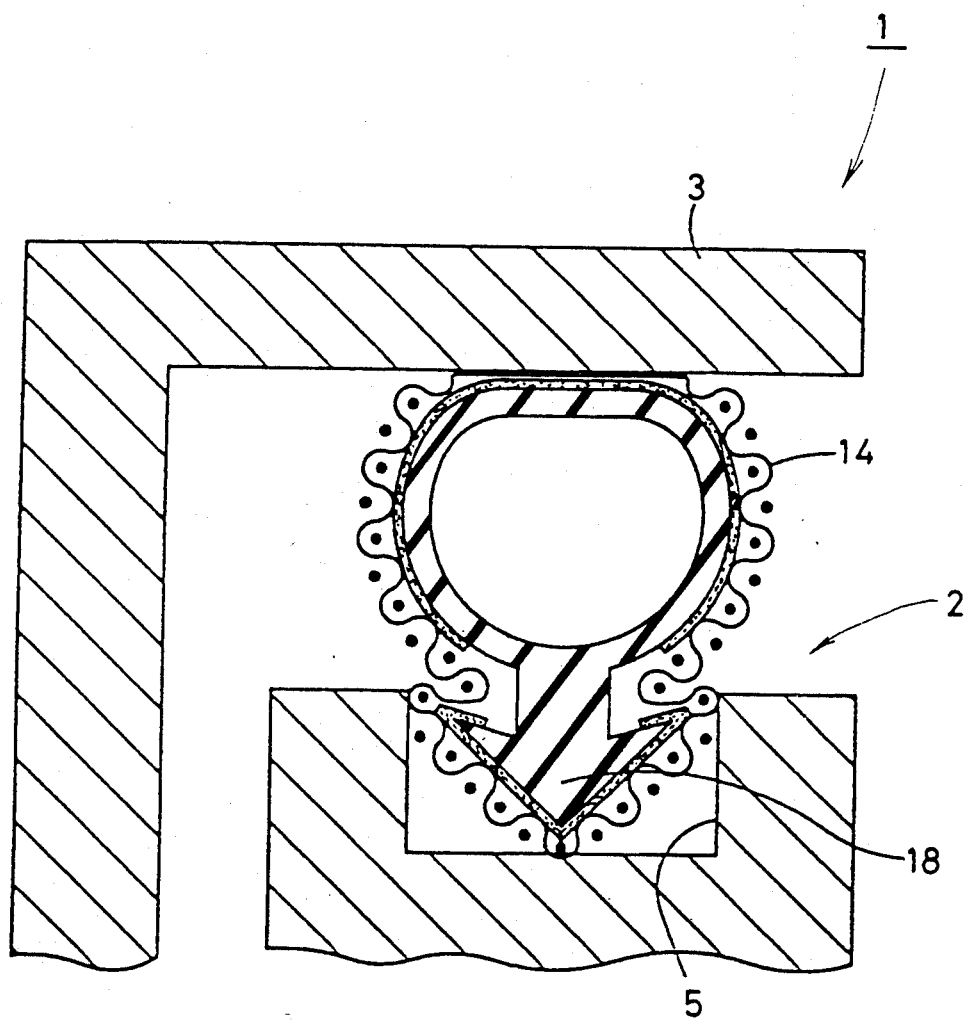
FIG. 4 is a cross-sectional view showing the installed condition of the electromagnetic-shielding gasket of FIG. 1.

The housing 1 in which the electromagnetic-shielding gasket 10 is installed is molded of metal. As seen in FIG. 4, the housing 1 has a gap 2 which opens for containing an electronic device. A closure 3 to close the gap 2 is also molded of metal. The installing portion 18 of the gasket 10 is inserted into a groove 5 of the housing 1. The method of inserting the installing portion 18 into the groove 5 is to push the resilient core 12 by hand until the core 12 partially flattens, and insert the installing portion 18 into the groove 5 as the core 12 is being flattened. The anchor-shaped installing portion 18 of the core 12, once inserted into the groove 5, does not easily come out of the groove 5. When the closure 3 of the housing 1 is closed, the gasket 10 is pressed down by the closure 3. Since the core 12 is resilient, the core 12 is deformed elastically by the pressure of the closure 3. The elastic deformation occurs greatly at the corner portion 25 of the core 12. However, the metal mesh 14 is not tensiled or bent by the core 12 at the segregating portion 30 due to its non-attachment in that area.

Therefore, since a segregating portion 30 is formed on the surface of the corner portion 25 which attains great elastic deformation, the metal mesh 14 of the segregating portion 30 does not break even when the core 12 is compressed by the closure 3 and pulls the metal mesh 14. Moreover, the metal mesh 14 does not break by the elastic deformation of the core 12 when the core 12 is installed.

FIGS. 5 through 17 show the second through twelfth embodiments of the instant invention. In these embodiments, the resilient core 12 comprises an installing portion 18 and a segregating portion 30, which separates the metal mesh 14 as in the first embodiment. The major differences between the first embodiment and the other embodiments are the cross-sectional configuration of the core 12, the material of the core 12, the number of the segregating portions 30, along with other minor differences.

Figure 5:
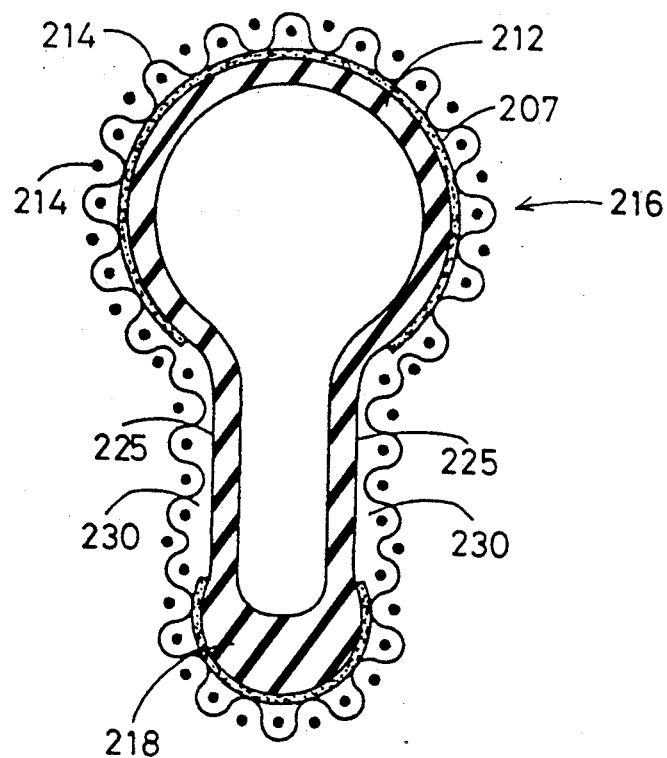
FIG. 5 is a cross-sectional view showing a second embodiment.

FIG. 5 shows the second embodiment of the invention. In this embodiment, a corner portion 225 having obtuse curved sections with a cavity formed inside that portion. The corner portion 225 is narrower than an installing portion 218 and a body 216. A segregating portion 230, which is not coated with an adhesive 207, is formed on the surface of the corner portion 225, so that a core 212 is separated from a metal mesh 214.

Figure 6:
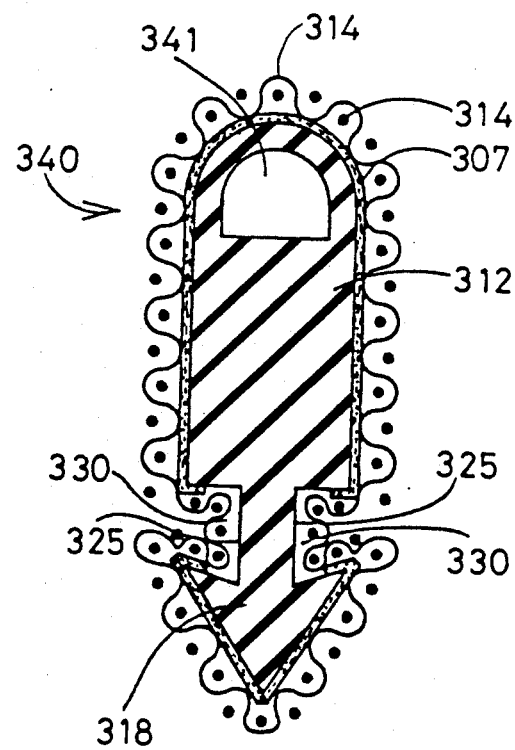
FIG. 6 is a cross-sectional view showing a third embodiment.

FIG. 6 shows the third embodiment of the invention. In this embodiment, the cross-sectional configuration of an installing portion 318 is the same as the installing portion 18 of the first embodiment. However, the cross-sectional configuration of the other portions are different from those of the first embodiment. Specifically, the configuration of the body 16 is different from the first embodiment, a ligulate projection 340 projects from a groove 5 of a housing 1(shown in FIG. 4), and is pressed down by a closure 3(shown in FIG. 4) and other components. The ligulate projection 340 has a ligulate cavity 341 formed therein. A segregating portion 330, which is similar to the segregating portion 30 of the first embodiment, is provided on the surface of a corner portion 325. A metal mesh 314, an adhesive 307 and a core 312, corresponding to the metal mesh 14, the adhesive 7 and the core 12 in the first embodiment, are also provided.

Figure 7:
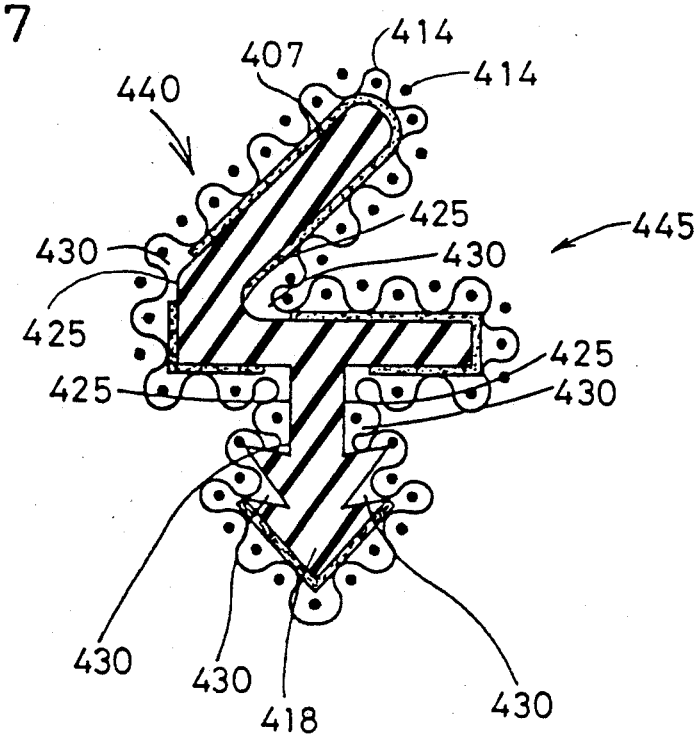
FIG. 7 is a cross-sectional view showing a fourth embodiment.

FIG. 7 shows the fourth embodiment of the invention. In this embodiment, the installing portion 418 has two combined anchor-shaped components and is connected to the body comprising a flat portion 445. A projection 440 projects, in a diagonal direction, from an edge of the flat portion 445. Segregating portions 430 are formed between the flat portion 445 and the projection 440 and a corner portion 425. The corner portion 425, having acute angles, is located near the installing portion 418. Another corner portion 425 having an obtuse angle is provided at an outside portion between the flat portion 445 and the projection 440. A segregating portion 430 is also formed on the acute angle corner portion 425 between the projection and the flat portion. An adhesive 407 and a metal mesh 414, corresponding to the adhesive 7 and the metal mesh 14 in the first embodiment, are also provided.

Figure 8:
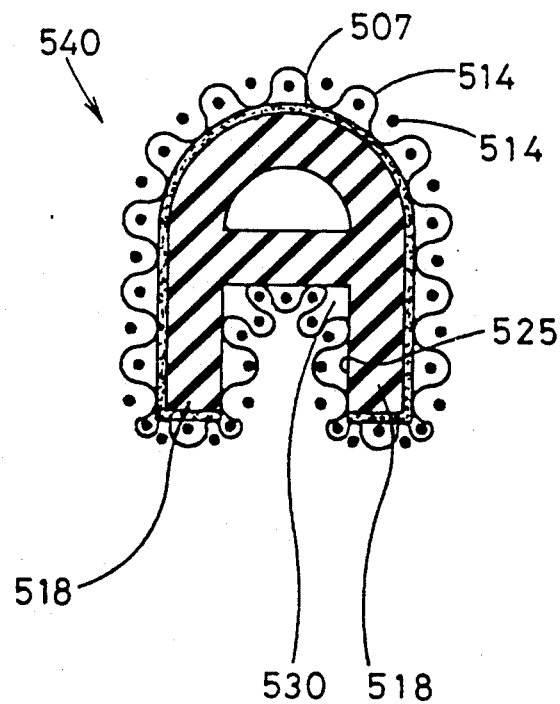
FIG. 8 is a cross-sectional view showing a fifth embodiment.

FIG. 8 shows the fifth embodiment of the invention. In this embodiment, two bar-shaped installing portions 518 are provided on a projection (body) 540 having a hollow inside. A corner portion 525 is located at the inside of the installing portions 518. A segregating portion 530 is formed on the surface of the corner portion 525. An adhesive 507 and a metal mesh 514, corresponding to the adhesive 7 and the metal mesh 14 in the first embodiment, are also provided.

Figure 9:
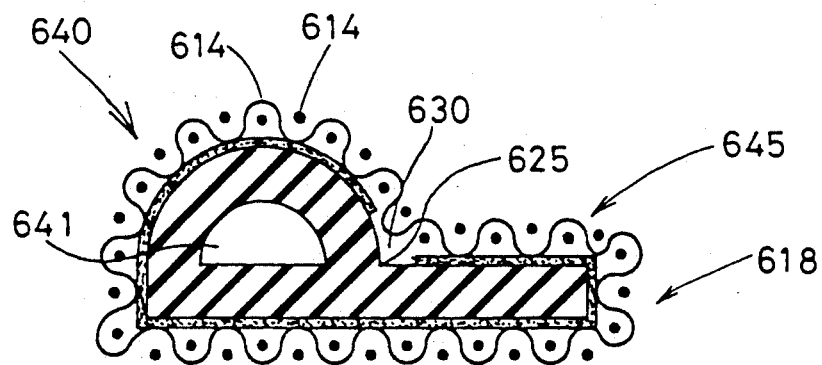
FIG. 9 is a cross-sectional view showing a sixth embodiment.
Figure 10:
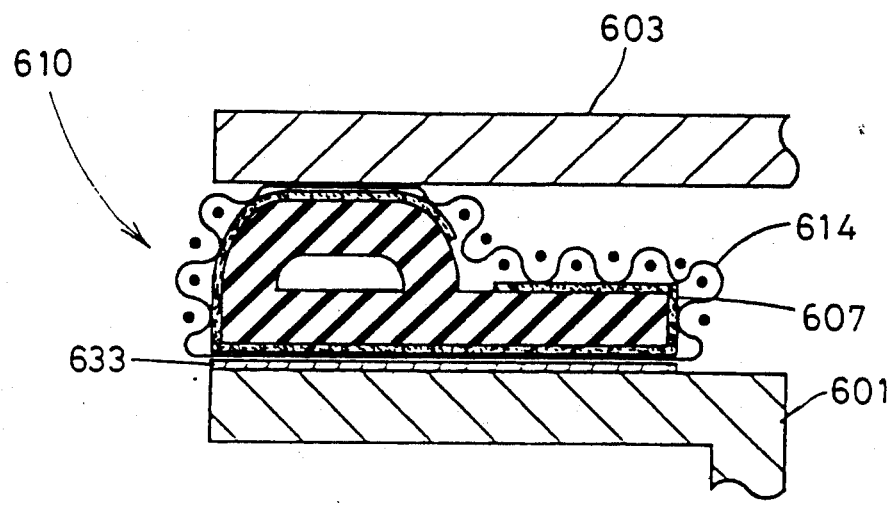
FIG. 10 is a cross-sectional view showing an installed condition of the six embodiment.

FIGS. 9 and 10 show the sixth embodiment of the invention. In this embodiment, a flat portion 645 is provided on the upper surface of an installing portion 618. A semicircular-shaped projection 640, having a semicircular-shaped cavity 641 formed inside, is provided on the flat portion 645. A corner portion 625 is provided between the flat portion 645 and the projection 640. A segregating portion 630 is formed on the surface of the corner portion 625. The bottom (first) surface of the flat portion 645 is the installing portion 618 which is fixed to a housing 601 by a bonding member 633. A conductive adhesive tape or agent can be used as the bonding member 633. A closure 603, an adhesive 607, a gasket 610 and a metal mesh 14, corresponding to the closure 3, the adhesive 7, the gasket 10 and the metal mesh 14 in the first embodiment, are also provided.

Figure 11:
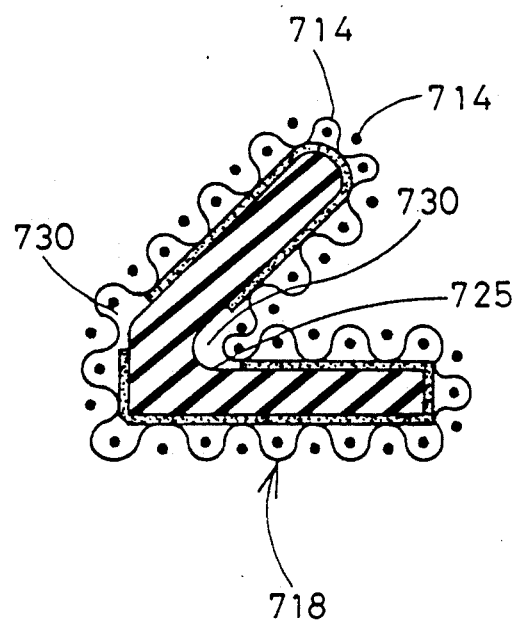
FIG. 11 is a cross-sectional view showing a seventh embodiment.

FIG. 11 shows the seventh embodiment of the invention. In this embodiment, as in the sixth embodiment, an installing portion 718 is the bottom surface and it is fixed to the housing 601 by a bonding member 633 (shown in FIG. 10). The location of a corner portion 725 and a segregating portion 730 are the same as those of the corner portion 425 and the segregating portion 430 of the fourth embodiment. A metal mesh 714, corresponding to the metal mesh 14 in the first embodiment, is also provided.

Figure 12:
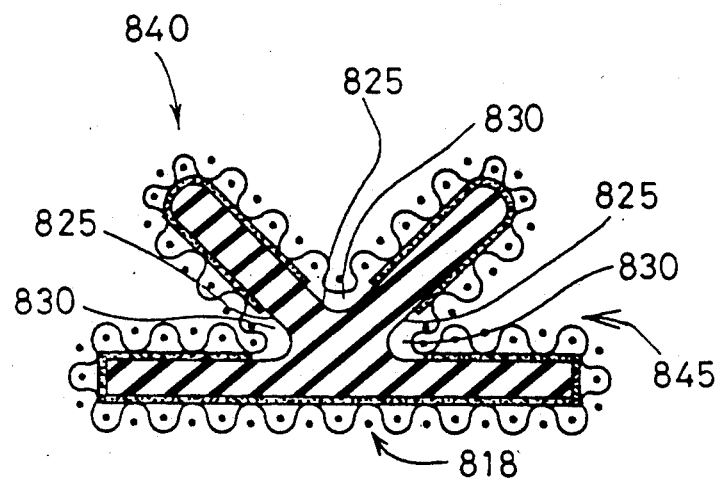
FIG. 12 is a cross-sectional view showing a eighth embodiment.

FIG. 12 shows the eighth embodiment of the invention. In this embodiment, a V-shaped projection 840 projects from a flat portion 845. Corner portions 825 are formed between the flat portion 845 and the projections 840, and between the V-shaped projections 840. Segregating portions 830 are formed on the surface of the corner portions 825. The installing portion 818 is the bottom surface of the flat portion and the body is the remainder of the gasket.

Figure 13:
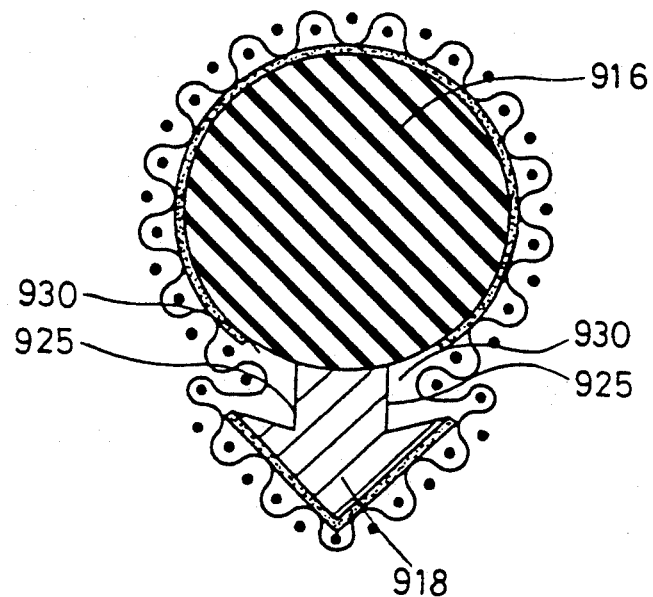
FIG. 13 is a cross-sectional view showing a ninth embodiment.

FIG. 13 shows the ninth embodiment of the invention. In this embodiment, the cross-sectional configuration is similar to that of the first embodiment. However, a body 916 does not have a hollow inside. The body 916 is molded of foam silicone rubber. The foam silicone rubber is formed by mixing silicone rubber and a foaming agent. An installing portion 918 is also molded of silicone rubber. Therefore, since the hardness of the body 916 is low, the body 916 elastically deforms with little pressure. However, a housing and a closure do not deform easily. When the hardness of the installing portion 918 is high, the installing portion 918 does not come out of a groove easily once inserted into the groove in the housing(shown in FIG. 4). The foam silicone rubber contains 30% by weight of carbon fiber in silicone rubber. Compared to an electromagnetic-shielding gasket comprising only silicone rubber, the gasket of this embodiment has preferable conductivity and compressibility having high reversion. The positions of corner portions 925 and segregating portions 930 are the same as those of the corner portions 25 and the segregating portions 30 of the first embodiment.

Figure 15:
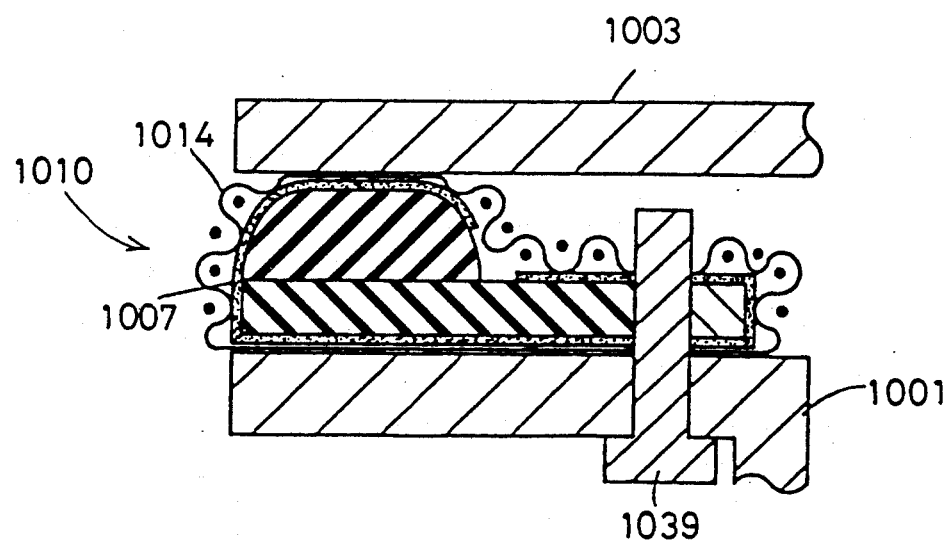
FIG. 15 is a cross-sectional view showing an installed condition of the tenth embodiment.
Figure 14:
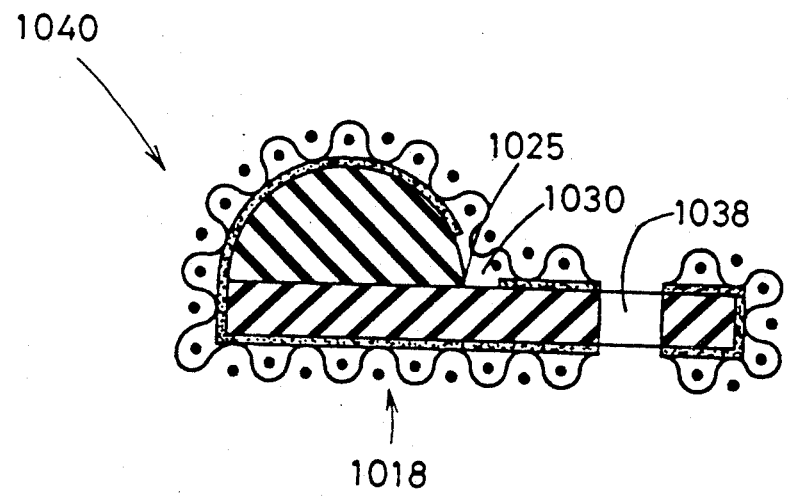
FIG. 14 is a cross-sectional view showing a tenth embodiment.

FIGS. 14 and 15 show the tenth embodiment of the invention. In this embodiment, a projection 1040 molded of foam silicone rubber does not have a hollow inside i.e. is solid. An installing portion 1018 is fixed to a housing 1001 by means of a connection member 1039 inserted through a hole 1038 of the gasket. The other components, such as a corner portion 1025 and a segregating portion 1030, are the same as those of the six embodiment. A closure 1003, an adhesive 1007, a gasket 1010 and a metal mesh 1014, corresponding to the closure 3, the adhesive 7, the gasket 10 and the metal mesh 14 in the first embodiment, are also provided.

Figure 16:
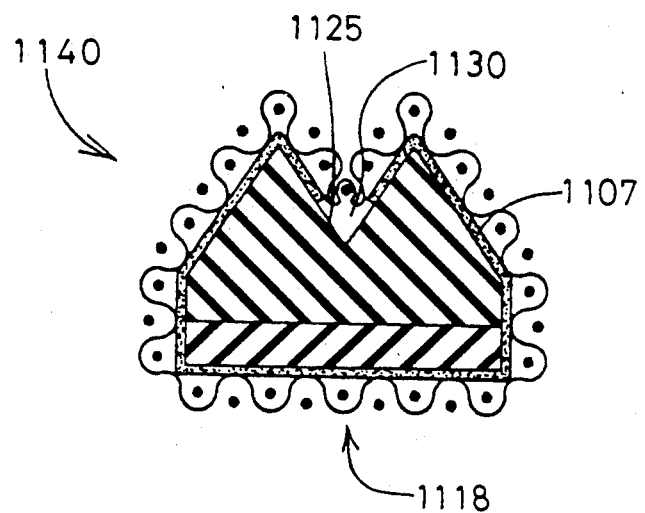
FIG. 16 is a cross-sectional view showing a eleventh embodiment.

FIG. 16 shows the eleventh embodiment of the invention. In this embodiment, a corner portion 1125 is provided between two continuous mountain-shaped projections 1140 molded of foam silicone rubber. A segregating portion 1130 is provided on the surface (valley) between the projections 1140. The installing portion 1118 is the bottom surface of the flat portion and the remainder of the gasket is the body 1116. A adhesive 1107, corresponding to the adhesive 7 in the first embodiment, is also provided.

Figure 17:
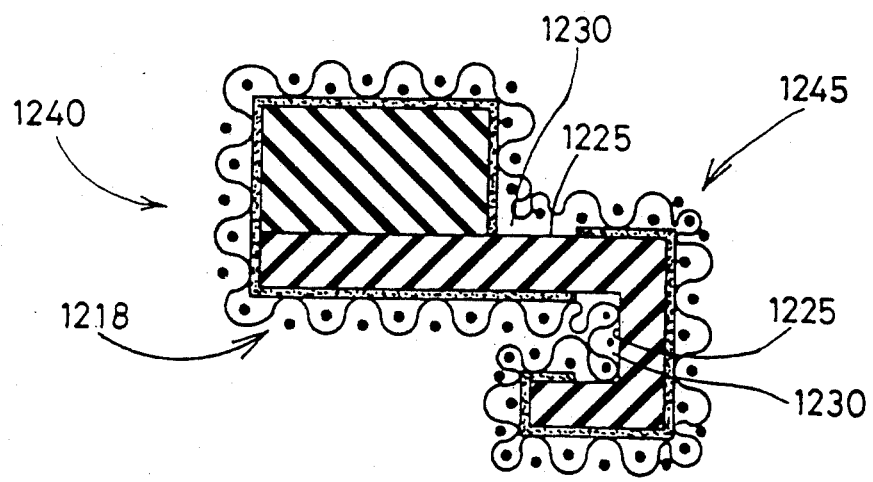
FIG. 17 is a cross-sectional view showing a twelfth embodiment.

FIG. 17 shows the twelfth embodiment of the invention. In this embodiment, a projection 1240 projects from a flat portion 1245 and is molded of foam silicone rubber. An installing portion 1218 consists of silicone rubber. An end of the installing portion 1218 is folded over to form a pair of right angles. Segregating portions 1230 are formed on the surface of a corner portion 1225 between the projection 1240 and the flat portion 1245, and on the surface of another corner portion 1225 where the installing portion 1218 is folded, respectively, to form a U-shaped connection member. The installing portion 1218 is the bottom surface of the flat portion and the folded over connection member, while the remainder of the gasket is the body.

Although specific embodiments of the present invention have been shown and explained for the purpose of illustration, the invention is not limited to the embodiments illustrated and described. This invention includes all embodiments and modifications that come within the scope of the claims.

For example, other than silicone rubber and foam silicone rubber for the resilient core 12, natural rubber, chloroprene rubber, ethylene, propylene rubber, butadiene rubber, styrene-butadiene rubber, nitrile rubber, chlorosulfonates polyethylene, fluoro-rubber, butyl rubber, urethane rubber, thermoplastic rubber (olefinic elastomar), and other foaming agents may be used. In addition, the metal mesh 14 may be knitted differently from the way shown in FIG. 2.

What is claimed is:

1. An electromagnetic-shielding gasket for shielding electronic components from electromagnetic waves when the gasket is inserted into a joint of a conductive housing which carries the electronic components, said gasket comprising:
   a core comprising:
      a body for engaging a first surface of the joint of the conductive housing,
      an installing portion, connected to the body, for securing the gasket to a second surface of the joint of the conductive housing, and
      at least one transition portion;
   a metal mesh circumscribing the body, the installing portion and the at least one transition portion; and
   means for attaching the metal mesh to a substantial portion of the core;
   wherein the at least one transition portion is free of the attaching means thereby forming a segregating portion in the at least one transition portion, the segregating portion allows the metal mesh to move freely adjacent the at least one transition portion and thereby prevents the metal mesh from breaking when the core is subjected to the elastic deformation during positioning of the gasket in the joint of a conductive housing and during use of the gasket.

2. A gasket according to claim 1, wherein the means for attaching the metal mesh to the core is an adhesive.

3. A gasket according to claim 2, wherein the adhesive is a rubber macromolecule adhesive.

4. A gasket according to claim 1, wherein the at least one transition portion is located between the body and the installing portion and the transition portion has a smaller cross-sectional width than the body and the installing portion.

5. A gasket according to claim 4, wherein the body is at least partially hollow.

6. A gasket according to claim 4, wherein the body and the installing portion are solid.

7. A gasket according to claim 4, wherein the installing portion has an arrow-shaped cross-section.

8. A gasket according to claim 4, wherein the transition portion is hollow.

9. A gasket according to claim 4, wherein the body comprises a ligulate projection having a ligurate cavity formed therein.

10. A gasket according to claim 4, wherein the body further comprises a projection projecting diagonally from an edge of a surface of the body remote from the installing portion, and
the installing portion comprises two sequentially connected arrow-shaped cross-sectional members.

11. A gasket according to claim 1, wherein the installing portion comprises two bar-shaped installing members extending from one surface of the body and a projection, having a hollow inside, extending from an opposite surface of the body.

12. A gasket according to claim 1, wherein the body comprises a flat portion,
the installing portion is a first surface of the flat portion, and
the flat portion further comprising, on a surface opposite the first surface of the flat portion, a semicircular-shaped projection having a semicircular-shaped cavity formed therein.

13. A gasket according to claim 1, wherein the body comprises a flat portion,
the installing portion is a first surface of the flat portion, and
the flat portion further comprising, on a surface opposite the first surface of the flat portion, a projection projecting diagonally from an edge of the opposite surface of the flat portion.

14. A gasket according to claim 1, wherein the body comprises a flat portion,
the installing portion is a first surface of the flat portion, and
the flat portion further comprising, on a surface opposite the first surface of the flat portion, a V-shaped projection projecting from the opposite surface of the flat portion.

15. A gasket according to claim 1, wherein the body comprises a flat portion,
the installing portion is a first surface of the flat portion, and
the flat portion further comprising, on a surface opposite the first surface of the flat portion, a solid semicircular-shaped projection.

16. A gasket according to claim 15, wherein the flat portion further comprises an attaching hole for receiving a connection member for attaching the gasket to the conductive housing.

17. A gasket according to claim 1, wherein the body comprises a flat portion,
the installing portion is a first surface of the flat portion, and
the flat portion further comprising, on a surface opposite the first surface of the flat portion, a pair of continuous mountain-shaped projections and the at least one transition portion is formed in a valley between said two continuous mountain-shaped projections.

18. A gasket according to claim 1, wherein the body comprises a flat portion,
the installing portion is a first surface of the flat portion, and
the flat portion further comprising, on a surface opposite the first surface of the flat portion, a projection extending from the opposite surface of said flat portion, and
the installing portion further comprising a folded over member forming a pair of right angles for engaging and securing the gasket to a flange member.

19. A gasket according to claim 1, wherein the metal mesh is formed from a material selected from the group consisting of tinning copper wire, copper welded wire, monel wire, stainless wire, aluminum wire, and tinning copper foil wire, and
the core which is made of a material selected from the group consisting of silicone-rubber, foam silicone-rubber and natural rubber.

20. A gasket according to claim 2, wherein between one and four transition portions are provided on the gasket and each transition portion is provided with a segregating portion which is free of the adhesive.

* * * * *